(12) United States Patent
Huang et al.

(10) Patent No.: US 7,082,230 B2
(45) Date of Patent: Jul. 25, 2006

(54) OPTICALLY MODULATED SCATTERER AND ARRAY THEREOF

(75) Inventors: Ming Chieh Huang, Taipei (CN); Wen Lie Liang, London (GB); Wen Tron Shay, Hsinchu (CN)

(73) Assignee: Industrial Technology Research Institute, Hsinchu (TW)

( * ) Notice: Subject to any disclaimer, the term of this patent is extended or adjusted under 35 U.S.C. 154(b) by 72 days.

(21) Appl. No.: 10/936,798

(22) Filed: Sep. 9, 2004

(65) Prior Publication Data

US 2005/0140550 A1    Jun. 30, 2005

(30) Foreign Application Priority Data

Dec. 25, 2003    (TW) .............................. 92136918 A

(51) Int. Cl.
*G02B 6/00*    (2006.01)
(52) U.S. Cl. .......................................... 385/12; 324/96
(58) Field of Classification Search .................. 385/12; 324/96; 398/115
See application file for complete search history.

(56) References Cited

U.S. PATENT DOCUMENTS 4,305,153 A    12/1981    King ........................... 455/67

2004/0131301 A1 *    7/2004    Liang et al. .................. 385/12

OTHER PUBLICATIONS

G. Hygate et al., "Measuring microwave fields directly with an optically modulated scatterer," Mea. Sci. Technol. 1 (1990) pp. 703-709.

W. Liang et al., "A Probe for Making Near-Field Measurements with Minimal Disturbance: The Optically Modulated Scatterer," IEEE Transactions on Antennas and Propagation, vol., 45, No. 5, May 1997, pp. 772-780.

* cited by examiner

*Primary Examiner*—Hoang V. Nguyen
(74) *Attorney, Agent, or Firm*—Volentine Francos & Whitt, PLLC

(57) ABSTRACT

The present optically modulated scatterer comprises a substrate, an antenna positioned on the substrate, an optical switch connected to the antenna, and an optical waveguide connected to the optical switch. The antenna includes a first conductive line and a second conductive line, the optical switch electrically connects the first conductive line and the second conductive line, and the optical waveguide can transmit an optical modulating signal to the optical switch. In addition, the antenna can be a loop-shaped antenna with two free ends, and the optical switch electrically connects the two free ends. The optically modulated scatter array of the present invention comprises a first substrate and a plurality of optically modulated scatterers positioned on the surface of the first substrate in a one-dimensional or a two-dimensional array manner.

19 Claims, 11 Drawing Sheets

OPTICALLY MODULATED SCATTERER AND ARRAY THEREOF

BACKGROUND OF THE INVENTION (A) Field of the Invention

The present invention relates to an optically modulated scatterer and array thereof, and more particularly, to an optically modulated scatterer and array thereof for measuring a spatial distribution of an electromagnetic signal without interference. The optically modulated scatterer and array thereof is an important tool for measuring the spatial distribution of the electromagnetic field.

(B) Description of the Related Art

Since a wireless communication system uses an antenna to transmit and receive an electromagnetic signal, how to make the electromagnetic field emitted by the antenna to comply with the specifications is an important subject for improving the antenna quality. In addition, the intensity of the electromagnetic wave emitted by the wireless communication product must be lower than the specific absorption rate (SAR) specified by the international safety standard to come into the market, therefore the SAR measurement technique is very important for the development of the cell phone. Presently, there are many electromagnetic wave measurement techniques; one of them utilizes the modulated scatterer to measure the distribution of the electromagnetic field.

The conventional technique uses a modulated scatterer array to measure the electromagnetic field, wherein an electrical modulating signal is transmitted by a conductive wire to modulate a diode inside the scatterer and incorporates fast scanning to measure the electromagnetic field. The bias voltage applied to the diode inside the scatterer is transmitted through the conductive wire; however, the conductive wire will irradiate electromagnetic waves, which interfere with the electromagnetic signal to be measured. U.S. Pat. No. 4,305,153 discloses an electromagnetic field measurement technique using a light beam incorporating a chopper to modulate the diode inside the scatterer, wherein the bias voltage is supplied by a solar cell. In addition, G. Hygate et al. disclose an electromagnetic field measurement technique without electrical interference, which uses a phototransistor to produce an optically modulated scatterer, i.e., uses optical device rather than the conductive wire to modulate the scatter (SEE: Measuring microwave fields directly with an optically modulated scatterer, 1990, Meas. Sci. Technol., and A Probe for Making Near-Field Measurements with Minimal Disturbance: The Optically Modulated Scatterer). However, G. Hygate et al. only disclose the utilization of the optically modulated scatterer in the electromagnetic signal sensing system, the detailed structure of the optically modulated scatterer is not disclosed. Under this situation, it is difficult for one skilled in the art to overcome the shortcomings of the prior art using the disclosure by G. Hygate et al.

SUMMARY OF THE INVENTION

The objective of the present invention is to provide an optically modulated scatterer and array thereof for measuring the spatial distribution of an electromagnetic signal without interference.

In order to achieve the above-mentioned objective, and avoid the problems of the prior art, the present optically modulated scatterer comprises a substrate, an antenna positioned on the substrate, an optical switch connected to the antenna, and an optical waveguide connected to the optical switch. The antenna includes a first conductive line and a second conductive line, the optical switch electrically connects the first conductive line and the second conductive line, and the optical waveguide can transmit an optical modulating signal to the optical switch. In addition, the antenna can be a loop-shaped antenna with two free ends, and the optical switch electrically connects the two free ends. The optically modulated scatter array of the present invention comprises a first substrate and a plurality of optically modulated scatterers positioned on the surface of the first substrate in a one-dimensional or a two-dimensional array manner.

BRIEF DESCRIPTION OF THE DRAWINGS

Other objectives and advantages of the present invention will become apparent upon reading the following description and upon reference to the accompanying drawings in which.

DETAILED DESCRIPTION OF THE INVENTION

Figure 1:
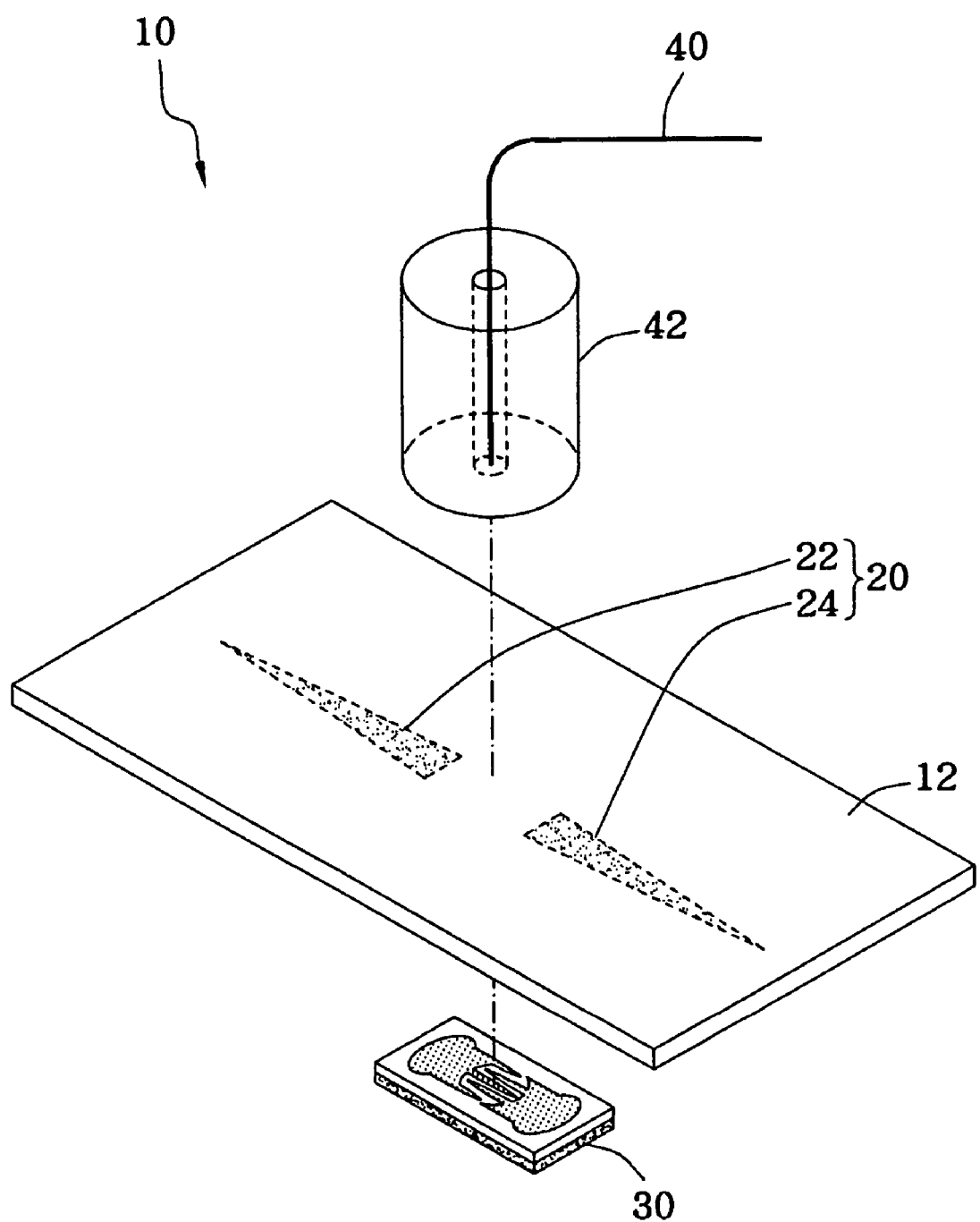
FIG. 1 illustrates an optically modulated scatterer according to the first embodiment of the present invention.

FIG. 1 illustrates an optically modulated scatterer 10 according to the first embodiment of the present invention. As shown in FIG. 1, the optically modulated scatterer 10 comprises a substrate 12, an antenna 20 positioned on the bottom surface of the substrate 12, an optical switch 30 electrically connected to the antenna 20, an optical waveguide 40 for transmitting an optical modulating signal to the optical switch 30, and a sheath 42 for fixing the optical waveguide 40 on the upper surface of the substrate 12. The antenna 20 includes a first conductive line 22 and a second conductive line 24 positioned on the bottom surface of the substrate 12, while the optical switch 30 can electrically connect the first conductive line 22 and the second conductive line 24.

Figure 2:
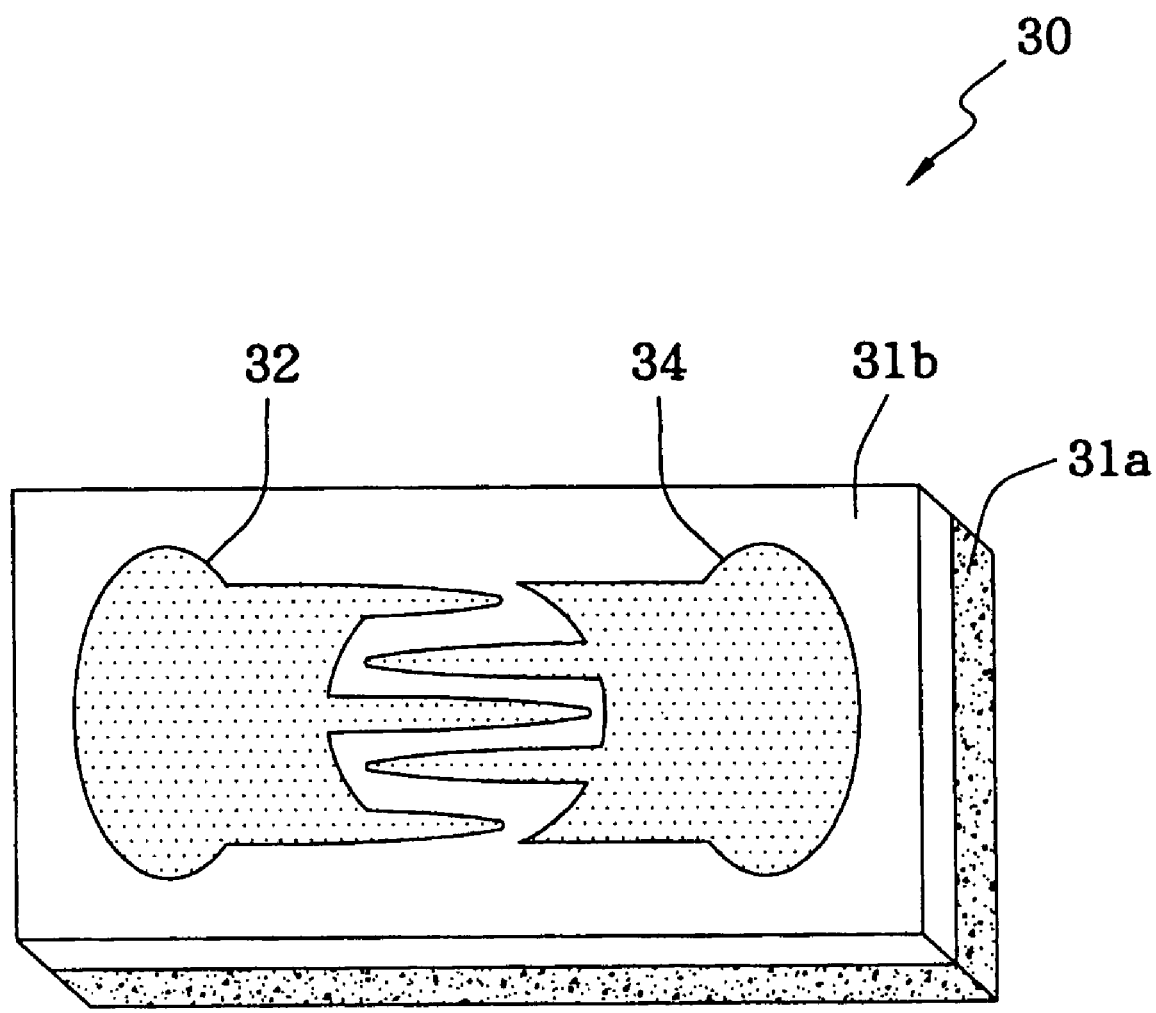
FIG. 2 is a schematic diagram of an optical switch according to the present invention.

FIG. 2 is a schematic diagram of the optical switch 30 according to the present invention. As shown in FIG. 2, the optical switch 30 comprises an intrinsic GaAs (gallium arsenide) substrate 31a, a highly-doped GaAs substrate 31b, a first interdigital electrode 32 and a second interdigital electrode 34 positioned on the highly-doped GaAs substrate 31b. The first interdigital electrode 32 and the second interdigital electrode 34 are electrically connected to the first conductive line 22 and the second conductive line 24 of the antenna 20, respectively. The optical waveguide 40 is aimed at an interdigital region between the first interdigital electrode 32 and the second interdigital electrode 34 of the optical switch 30. In addition, the highly-doped GaAs substrate 31b can be P-type or N-type, and forms an ohmic contact with the first interdigital electrode 32 and the second interdigital electrode 34.

When a light beam with appropriate energy irradiates the interdigital region of the optical switch 30, conductive electrons and holes are generated to reduce the resistance between the first interdigital electrode 32 and the second interdigital electrode 34 of the optical switch 30 so that the first interdigital electrode 32 and the second interdigital electrode 34 become conductive to couple the first conductive line 22 and the second conductive line 24 into a relatively longer metallic scattering body. In this way, the overall scattering cross-section is increased to enhance a modulated scattering signal emitted from the optically modulated scatterer 10, wherein the enhanced modulated scattering signal is in proportion or in square proportion to the electromagnetic field where the optically modulated scatterer 10 is positioned.

Referring to FIG. 1, the optical modulating signal transmitted by the optical waveguide 40 penetrates the substrate 12 to irradiate the interdigital region of the optical switch 30. Therefore, the substrate 12 is preferably formed of insulatvie material without absorbing the optical modulating signal to avoid signal decay on penetrating the substrate 12. Preferably, the substrate 12 is a mica substrate.

Figure 3:
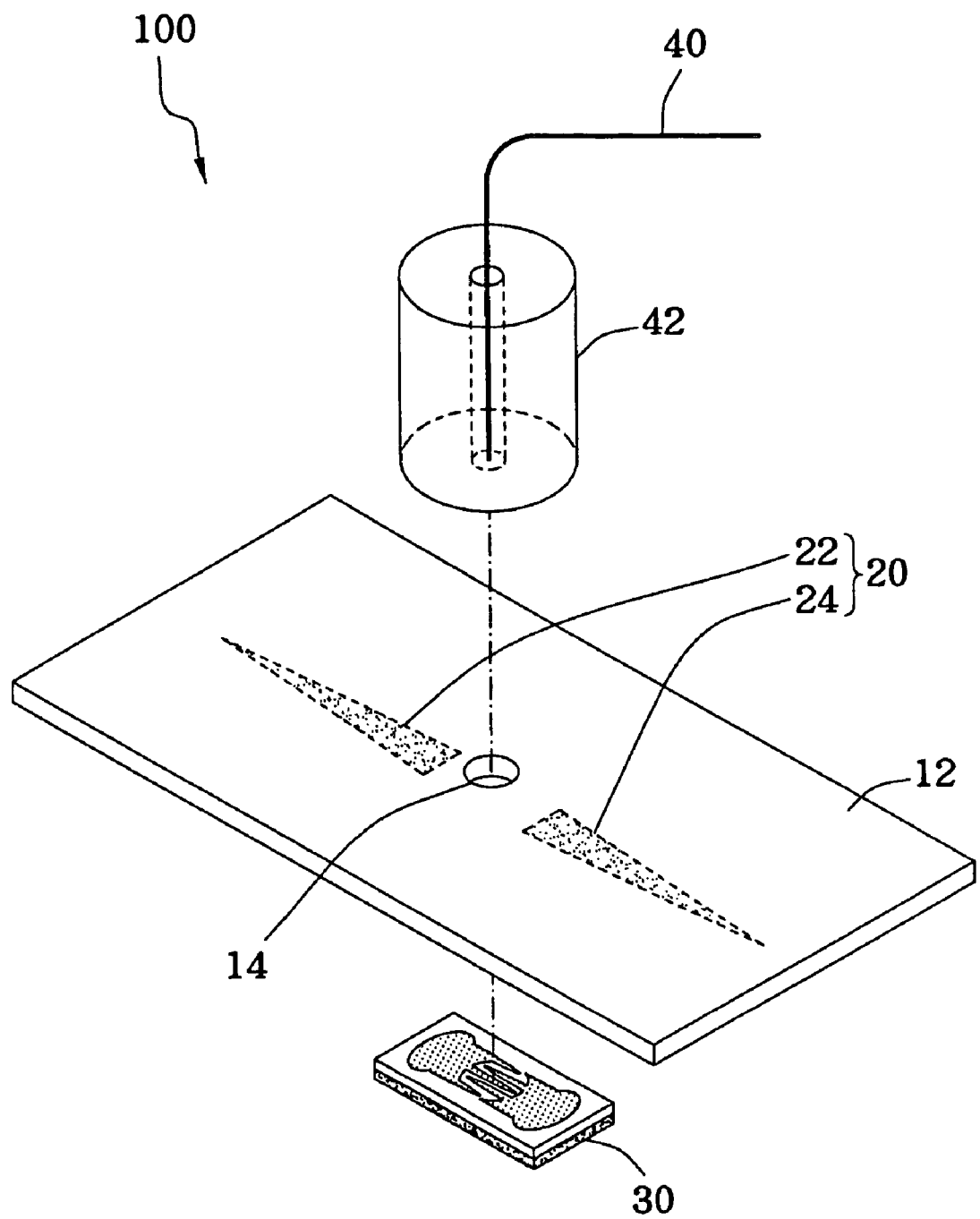
FIG. 3 illustrates an optically modulated scatterer according to the second embodiment of the present invention.

FIG. 3 illustrates an optically modulated scatterer 100 according the second embodiment of the present invention. As shown in FIG. 3, the substrate 12 further comprises an opening 14 positioned between the first conductive line 22 and the second conductive line 24, and the optical switch 30 and the optical waveguide 40 are aimed at the opening 14, wherein the substrate 12 can be made of microcrystal glass. Consequently, the optical waveguide 40 can transmit the optical modulating signal through the opening 14 directly to the optical switch 30, without any concern of the signal decay originating from the penetration of the substrate 12. The optically modulated scatterer 100 can be set up on a moving platform to perform a spatial scanning to measure spatial amplitude and phase distribution of an electromagnetic field.

Figure 4:
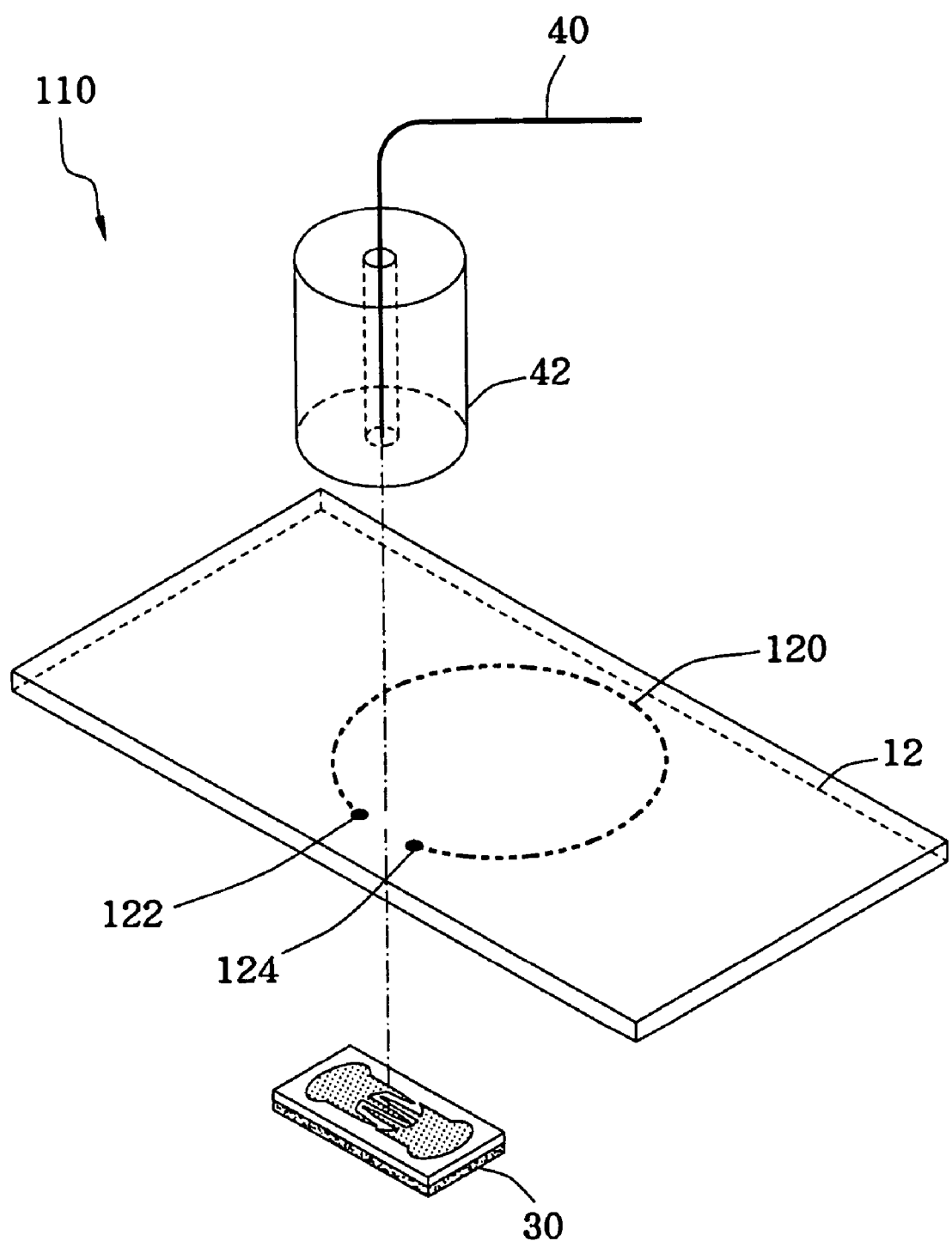
FIG. 4 illustrates an optically modulated scatterer according to the third embodiment of the present invention.

FIG. 4 illustrates an optically modulated scatterer 110 according the third embodiment of the present invention. Compared with the optically modulated scatterer 10 in FIG. 1, the optically modulated scatterer 110 in FIG. 4 uses a loop-shaped antenna 120 with two free ends 122, 124. When the optical switch 30 electronically connect the two free ends 122 and 124, the loop-shaped antenna 120 can function to scatter a magnetic field to be measured.

Figure 5:
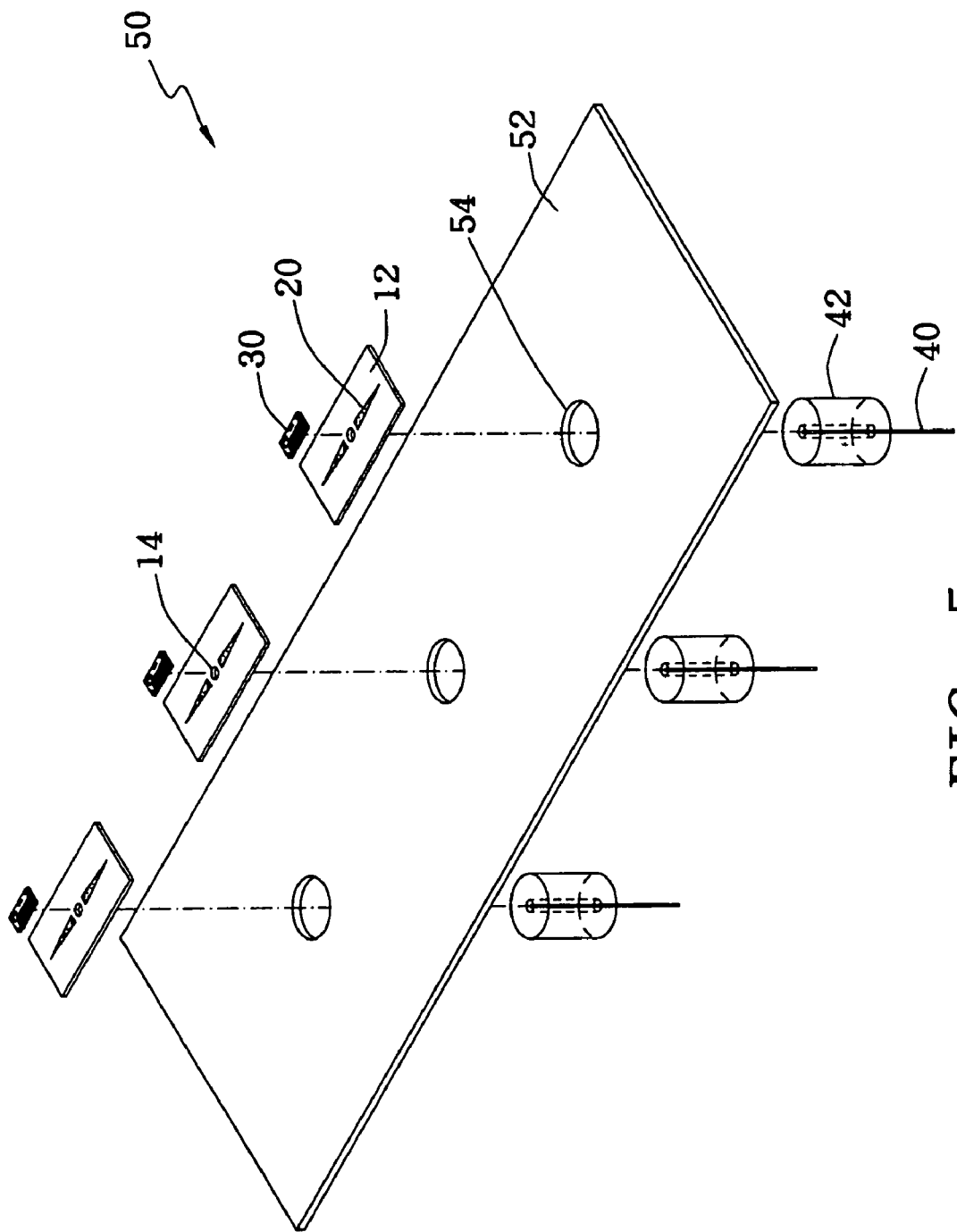
FIG. 5 illustrates an optically modulated scatterer array according to the first embodiment of the present invention.

FIG. 5 illustrates an optically modulated scatterer array 50 according to the first embodiment of the present invention. As shown in FIG. 5, the optically modulated scatterer array 50 comprises a substrate 52, a plurality of openings 54 positioned on the substrate 52 and a plurality of optically modulated scatterers 10. The diameter of the opening 54 is preferably slightly larger than the diameter of the sheath 42 so that the sheath 42 can be fixed inside the opening 54. The plurality of optically modulated scatterers 10 are positioned on the substrate 52 in a one-dimensional array manner, i.e., positioned along one direction the substrate 52, which can be used to measure the one-dimensional distribution of the electromagnetic field to be measured. The substrate 12 of the optically modulated scatterer 10 has an opening 14, and the optical waveguide 40 transmits the optical modulating signal to the optical switch 30 through the opening 14.

Figure 6:
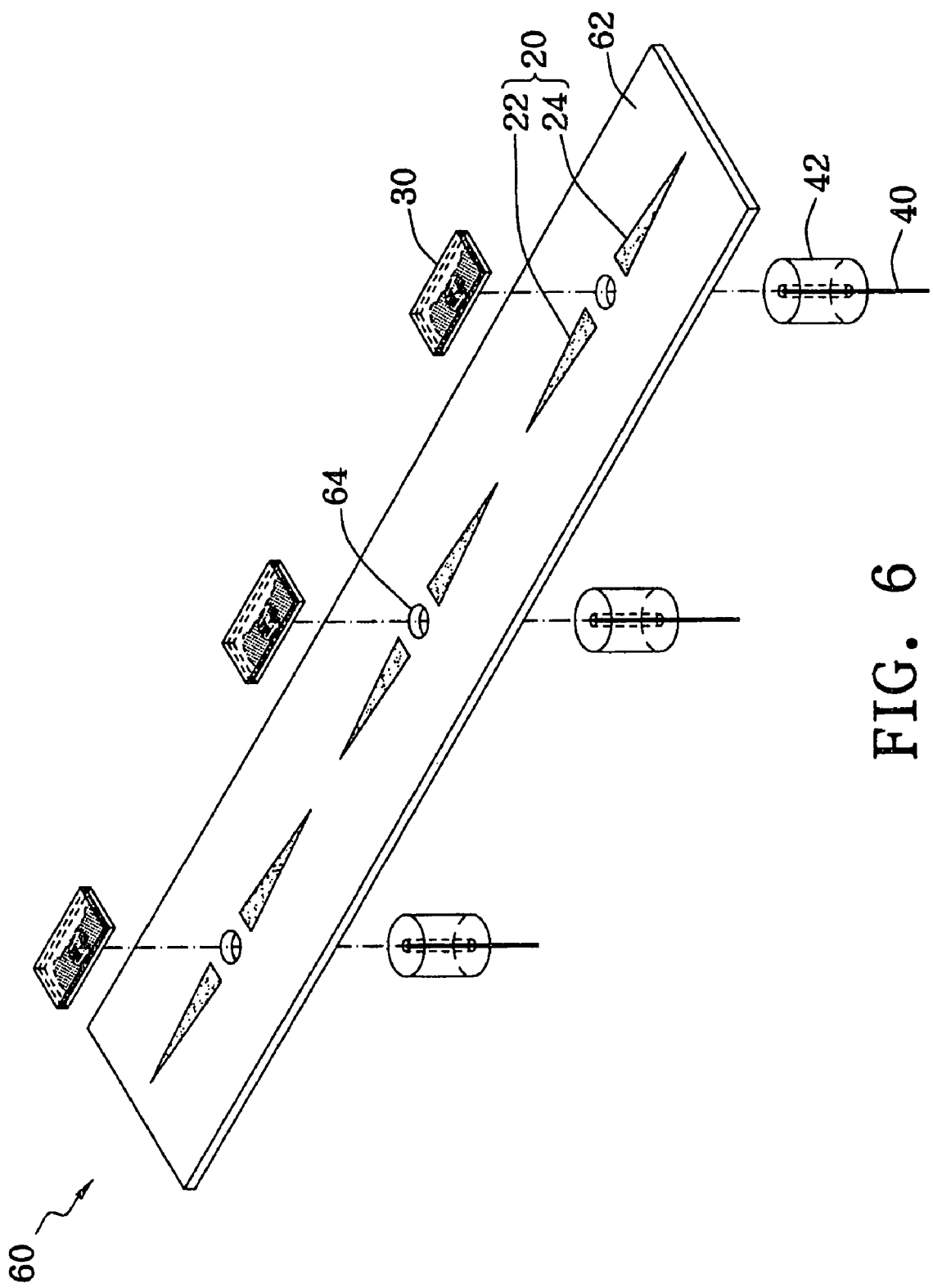
FIG. 6 illustrates an optically modulated scatterer array according to the second embodiment of the present invention.

FIG. 6 illustrates an optically modulated scatterer array 60 according to the second embodiment of the present invention. As shown in FIG. 6, the optically modulated scatterer array 60 comprises a substrate 62, a plurality of antennas 20 positioned on the substrate 62, a plurality of optical switches 30 for controlling the antenna 20, and a plurality of optical waveguides 40 for transmitting the optical modulating signal to the optical switch 30. Compared with the optically modulated scatterer array 50 shown in FIG. 5, the plurality of antennas 20 of the optically modulated scatterer array 60 are formed directly on the surface of the substrate 62. In addition, there is an opening 64 positioned between the first conductive line 22 and the second conductive line 24, and the optical waveguide 40 transmits the optical modulating signal through the opening 64 to irradiate the optical switch 30.

Figure 7:
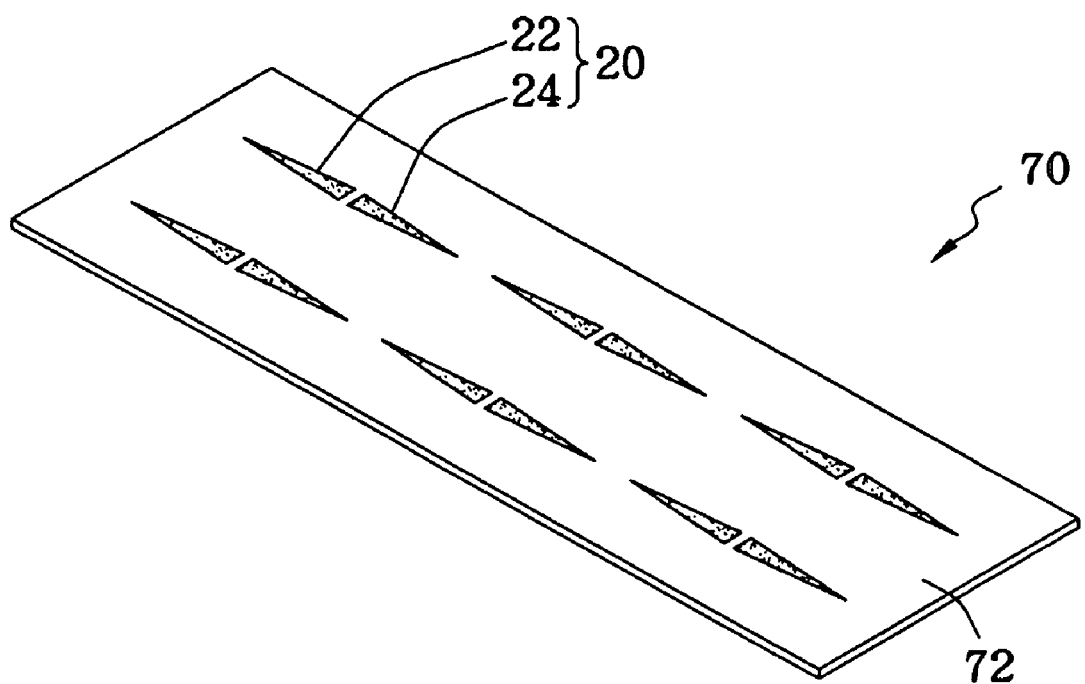
FIG. 7 illustrates an optically modulated scatterer array according to the third embodiment of the present invention.

FIG. 7 illustrates an optically modulated scatterer array 70 according to the third embodiment of the present invention, wherein only the antenna 20 is shown for the sake of clarity and the optical switch 30 and the optical waveguide 40 corresponding to each antenna 20 are not shown in the figure. As shown in FIG. 7, the optically modulated scatterer array 70 comprises a substrate 72 and a plurality of optically modulated scatterer 10 positioned in a two-dimensional array manner for measuring the two-dimensional distribution of the electromagnetic field.

Figure 8:
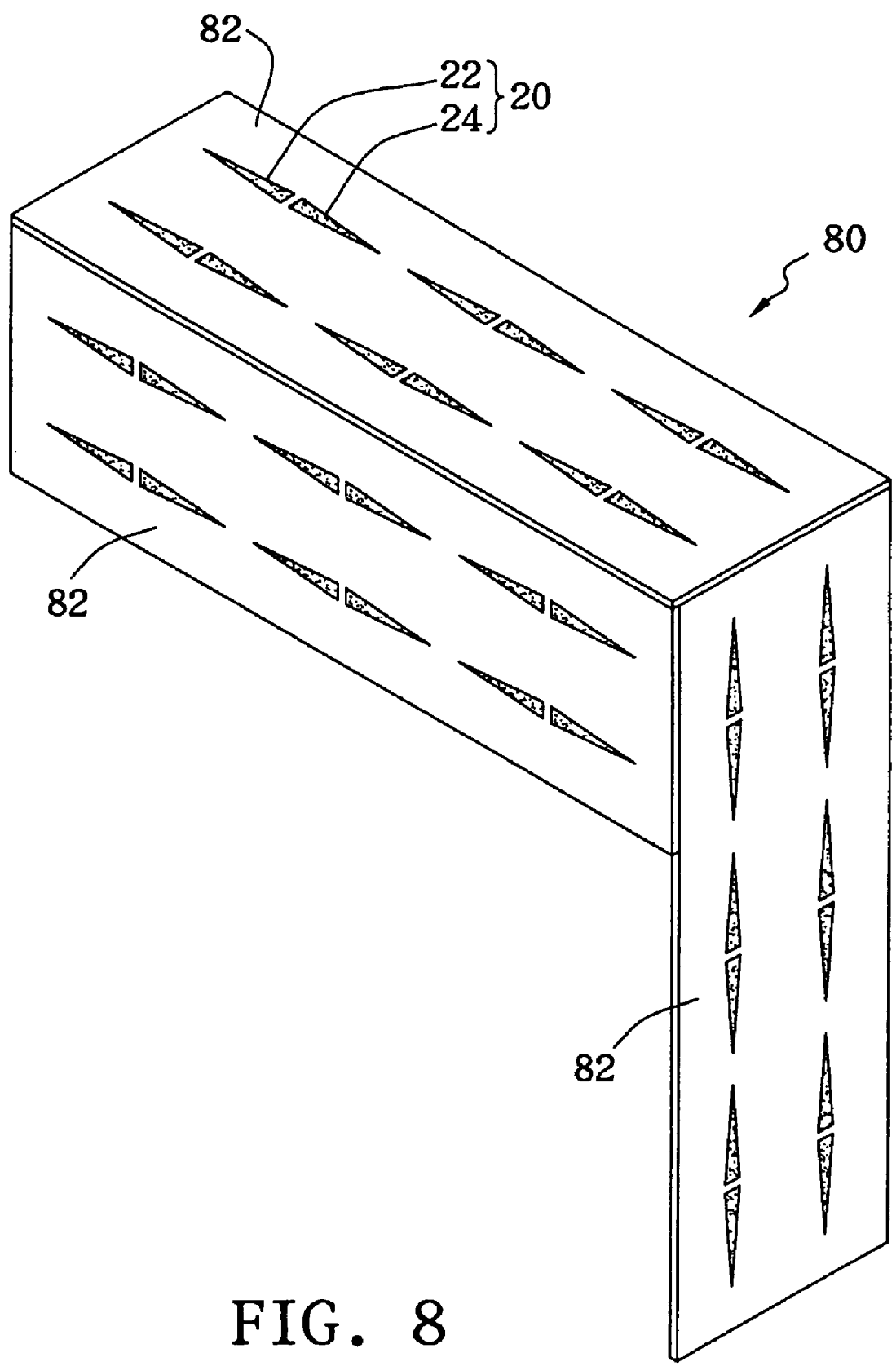
FIG. 8 illustrates an optically modulated scatterer array according to the fourth embodiment of the present invention.

FIG. 8 illustrates an optically modulated scatterer array 80 according to the fourth embodiment of the present invention, wherein only the antenna 20 is shown for the sake of clarity and the optical switch 30 and the optical waveguide 40 corresponding to each antenna 20 are not shown in the figure. As shown in FIG. 8, the optically modulated scatterer array 80 comprises three substrates 82 substantially perpendicular to each other, and each substrate 82 includes a plurality of scattering antennas 20 positioned in a two-dimensional array manner. The optically modulated scatterer array 80 can be used to measure the spatial distribution of the electromagnetic field.

Figure 9:
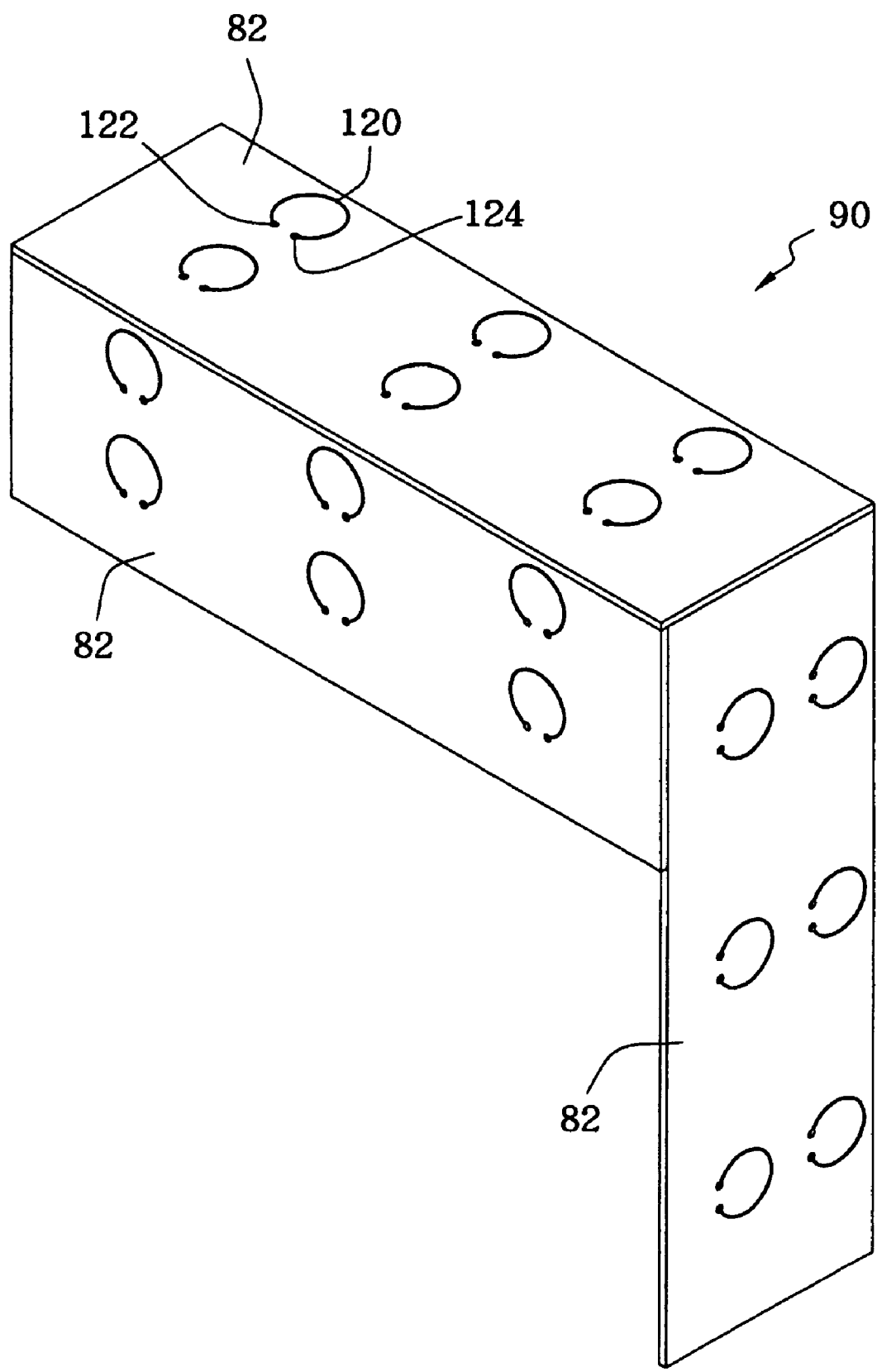
FIG. 9 illustrates an optically modulated scatterer array according to the fifth embodiment of the present invention.

FIG. 9 illustrates an optically modulated scatterer array 90 according to the fifth embodiment of the present invention. Compared with the optically modulated scatterer array 80 in FIG. 8, the optically modulated scatterer array 90 uses the loop-shaped antenna 120 rather than the antenna 20. Through switching and controlling the optical switches 30 (not shown in FIG. 9) that connects the plurality of loop-shaped antennas 120, the optically modulated scatterer array 90 can be used to measure the one-dimensional, two-dimensional or three-dimensional distribution of the electromagnetic field.

Figure 10:
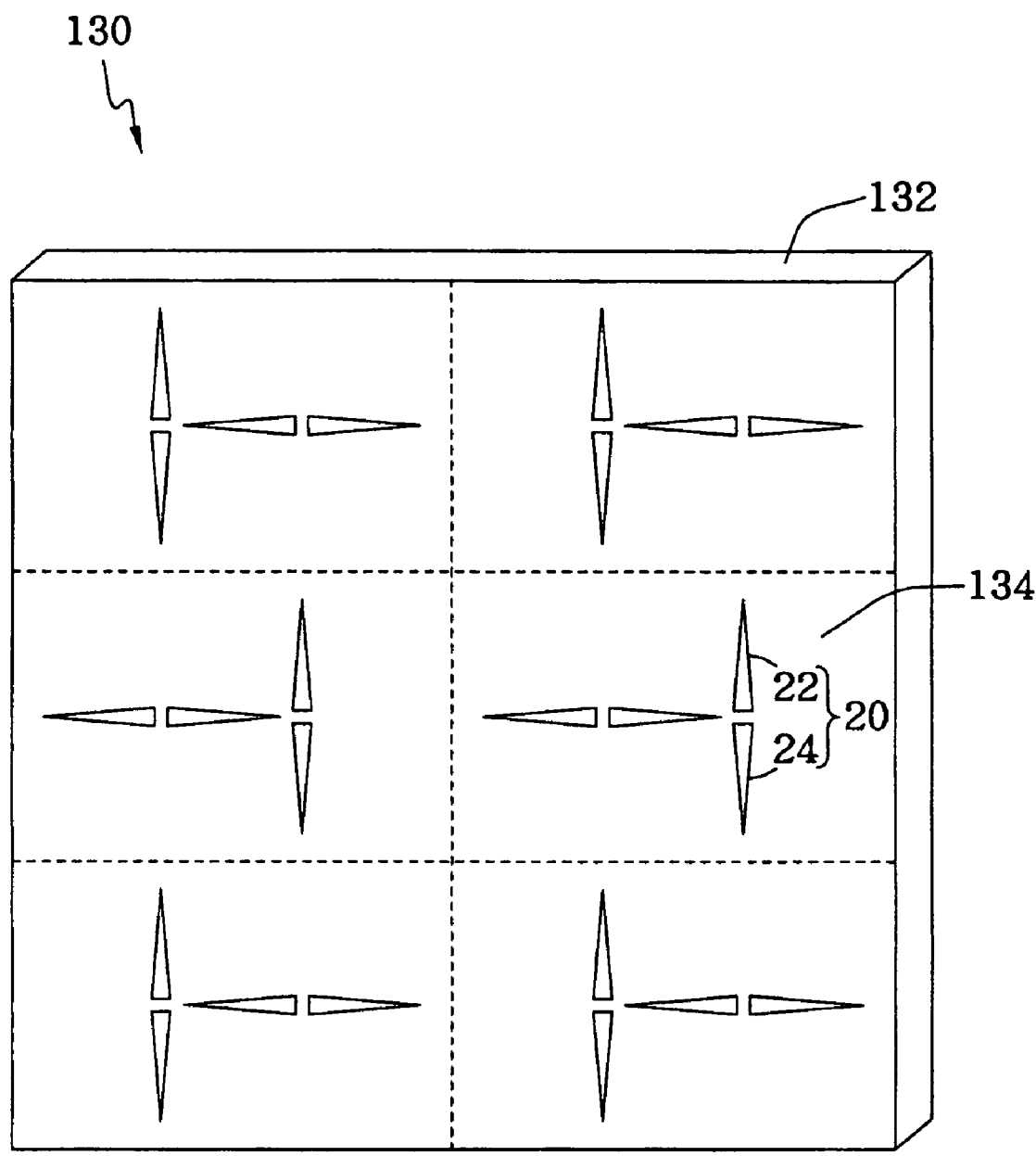
FIG. 10 illustrates an optically modulated scatterer array according to the sixth embodiment of the present invention.

FIG. 10 illustrates an optically modulated scatterer array 130 according to the sixth embodiment of the present invention, wherein only the antenna 20 of each optically modulated scatterer 10 is illustratively shown for the sake of clarity, and the corresponding optical switch 30 and the optical waveguide 40 are not shown. As shown in FIG. 10, the optically modulated scatterer array 130 comprises a substrate 132 including a plurality of optically modulated scatterers 10 positioned in a two-dimensional array manner. The antenna 20 of each optically modulated scatterer 10 is positioned on the substrate 132 in a substantially perpendicular manner for measuring the spatial distribution of the electromagnetic field. In the other words, the antennas can be grouped into a plurality of sets 134 with two antennas 20 substantially perpendicular to each other.

Figure 11:
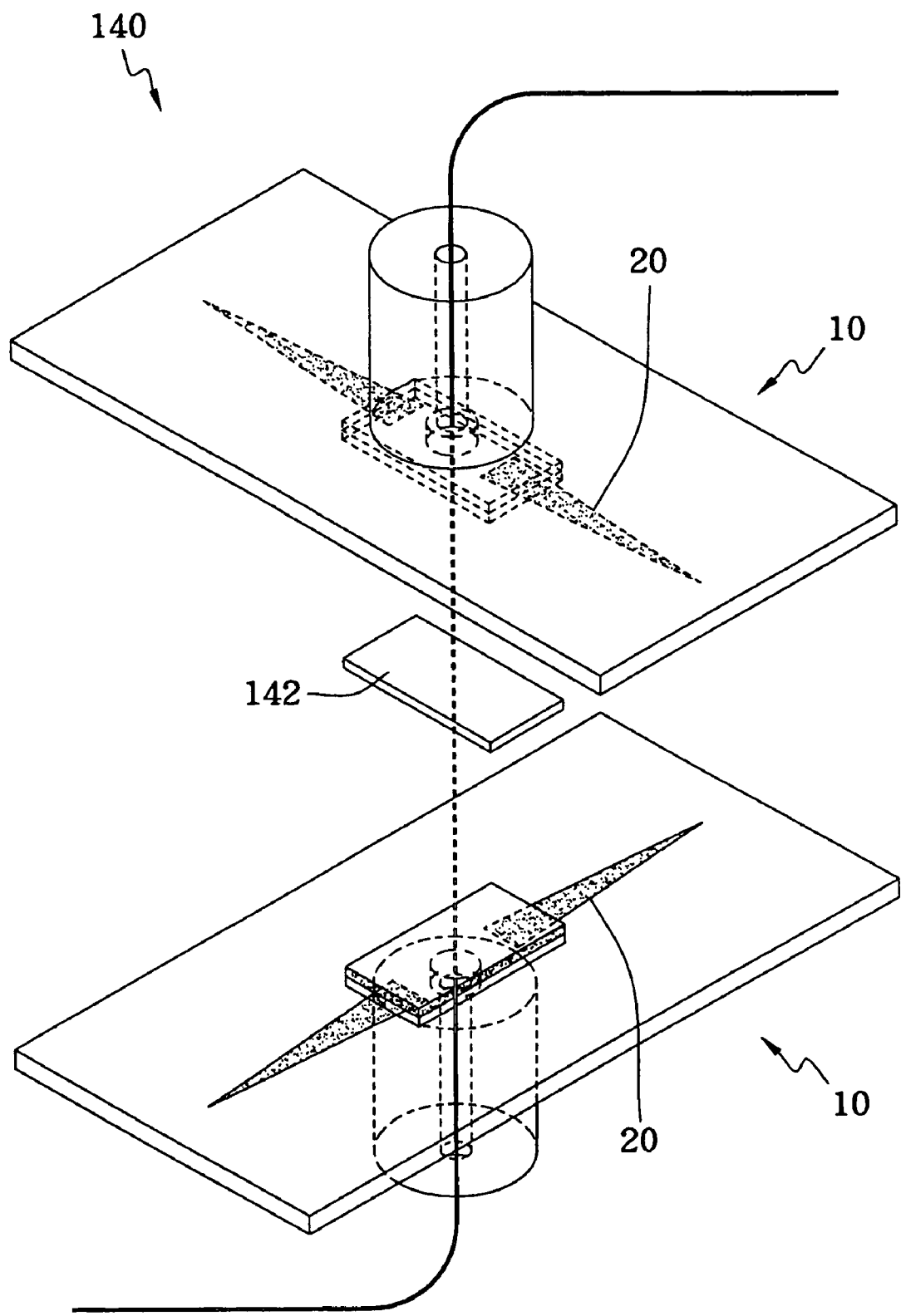
FIG. 11 illustrates an optically modulated scatterer array according to the seventh embodiment of the present invention.

FIG. 11 illustrates an optically modulated scatterer array 140 according to the seventh embodiment of the present invention. As shown in FIG. 11, the optically modulated scatterer array 140 comprises a substrate 142 and two optically modulated scatterers 10. The two optically modulated scatterers 10 are positioned on the upper and bottom surface of the substrate 142, respectively, and the two antennas 20 are substantially perpendicular to each other for measuring the spatial distribution of the electromagnetic field.

Compared with the scatterer modulated directly by the electrical signal according to the prior art, the present invention uses the optical waveguide 40 to transmit the optical modulating signal for modulating the optically modulated scatterer 10. Consequently, the present invention will not interfere with the electromagnetic signal to be measured on modulating the optically modulated scatterer 10. In addition, the present optically modulated scatterer 10 possesses high precision, high resolution and high fidelity to be applied to measure the spatial distribution of the electromagnetic field such as antenna near field, SAR distribution, electromagnetic wave propagation and electromagnetic compatibility analysis.

The above-described embodiments of the present invention are intended to be illustrative only. Numerous alternative embodiments may be devised by those skilled in the art without departing from the scope of the following claims.

What is claimed is:

1. An optically modulated scatterer, comprising:
   a substrate;
   an antenna positioned on the substrate and comprising a GaAs substrate, a first interdigital electrode positioned on the GaAs substrate, and a second interdigital electrode positioned on the GaAs substrate;
   an optical switch electrically connected to the antenna; and
   an optical waveguide for transmitting an optical signal to the optical switch.

2. The optically modulated scatterer of claim 1, wherein the antenna includes a first conductive line and a second conductive line positioned on the surface of the substrate, and the optical switch electrically connects the first conductive line and the second conductive line.

3. The optically modulated scatterer of claim 1, wherein the antenna is a loop-shaped antenna with two free ends, and the optical switch electrically connects the two free ends.

4. The optically modulated scatterer of claim 1, wherein the optical waveguide is aimed at an interdigital region between the first interdigital electrode and the second interdigital electrode.

5. The optically modulated scatterer of claim 1, wherein the first interdigital electrode and the GaAs substrate form an ohmic contact.

6. The optically modulated scatterer of claim 1, further comprising a sheath for fixing the optical waveguide on the substrate.

7. The optically modulated scatterer of claim 1, wherein the substrate is made of insulative material.

8. The optically modulated scatterer of claim 7, wherein the substrate is a mica substrate.

9. The optically modulated scatterer of claim 7, wherein the optical signal penetrates the substrate to the optical switch.

10. The optically modulated scatterer of claim 7, wherein the substrate is made of microcrystal glass.

11. The optically modulated scatterer of claim 7, wherein the substrate includes an opening, and the optical waveguide transmits the optical signal through the opening to the optical switch.

12. An optically modulated scatterer array, comprising:
    a second substrate; and
    a plurality of optically modulated scatterers positioned on the second substrate, wherein the optically modulated scatter comprises:
    a first substrate;
    an antenna positioned on the first substrate;
    an optical switch electrically connected to the antenna; and
    an optical waveguide for transmitting an optical signal to the optical switch.

13. The optically modulated scatterer array of claim 12, further comprising:
    a third substrate substantially perpendicular to the second substrate; and
    a plurality of optically modulated scatterers positioned on the third substrate.

14. The optically modulated scatterer array of claim 12, wherein the plurality of optically modulated scatterers are positioned on the second substrate, and grouped into a plurality of sets with two optically modulated scatterers substantially perpendicular to each other.

15. An optically modulated scatterer array, comprising:
    a first substrate;
    a plurality of antennas positioned on the first substrate in an array manner;
    a plurality of optical switches electrically connected to the plurality of antennas; and
    a plurality of optical waveguides for transmitting an optical signal to the plurality of optical switches.

16. The optically modulated scatterer array of claim 15, wherein the plurality of antennas are grouped into a plurality of sets with two antennas substantially perpendicular to each other.

17. The optically modulated scatterer array of claim 15, wherein the plurality of antennas are positioned along one direction on the first substrate in an array manner.

18. The optically modulated scatterer array of claim 15, further comprising:
    a second substrate substantially perpendicular to the first substrate; and
    a plurality of antennas positioned on the second substrate in an array manner.

19. The optically modulated scatterer array of claim 15, wherein the plurality of antennas are positioned on the first substrate in a one-dimensional array manner or in a two-dimensional array manner.

* * * * *

UNITED STATES PATENT AND TRADEMARK OFFICE
CERTIFICATE OF CORRECTION

PATENT NO. : 7,082,230 B2
APPLICATION NO. : 10/936798
DATED : July 25, 2006
INVENTOR(S) : Ming Chieh Huang et al.

It is certified that error appears in the above-identified patent and that said Letters Patent is hereby corrected as shown below:

Title page, item (75), change "(CN)" to -- (TW) -- (both instances).

Signed and Sealed this

Fifth Day of June, 2007

JON W. DUDAS
*Director of the United States Patent and Trademark Office*